US009286880B2

(12) United States Patent

Koga et al.

(10) Patent No.: US 9,286,880 B2

(45) Date of Patent: Mar. 15, 2016

(54) MASKING SOUND OUTPUTTING DEVICE AND MASKING SOUND OUTPUTTING METHOD

(75) Inventors: Hiroaki Koga, Hamamatsu (JP); Eiko Kobayashi, Hamamatsu (JP)

(73) Assignee: YAMAHA CORPORATION, Hamamatsu-Shi (JP)

( * ) Notice: Subject to any disclaimer, the term of this patent is extended or adjusted under 35 U.S.C. 154(b) by 253 days.

(21) Appl. No.: 13/822,166

(22) PCT Filed: Sep. 27, 2011

(86) PCT No.: PCT/JP2011/072131

§ 371 (c)(1), (2), (4) Date: Mar. 11, 2013

(87) PCT Pub. No.: WO2012/043597

PCT Pub. Date: Apr. 5, 2012

(65) Prior Publication Data

US 2013/0170662 A1 Jul. 4, 2013

(30) Foreign Application Priority Data

Sep. 28, 2010 (JP) ................................ 2010-216283
Mar. 16, 2011 (JP) ................................ 2011-057365

(51) Int. Cl.
*H04R 3/02* (2006.01)
*H04R 29/00* (2006.01)
*H03G 3/20* (2006.01)
*G10K 11/00* (2006.01)
*G10K 11/175* (2006.01)

(52) U.S. Cl.
CPC ........... *G10K 11/002* (2013.01); *G10K 11/175* (2013.01)

(58) Field of Classification Search
CPC ............. G10K 11/175; G10K 11/178; G10K 2210/51; G10K 11/002; H04K 1/02
USPC ............................................ 381/73.1, 56, 57
See application file for complete search history.

(56) References Cited

U.S. PATENT DOCUMENTS

2003/0026436 A1* 2/2003 Raptopoulos et al. ....... 381/71.4
2004/0019479 A1 1/2004 Hillis et al.

FOREIGN PATENT DOCUMENTS

JP 9319389 A 12/1997
JP 2005084645 A 3/2005

(Continued)

OTHER PUBLICATIONS

Japanese Office Action cited in counterpart application No. JP2011057365, dated Aug. 26, 2014. English translation provided.

(Continued)

*Primary Examiner* — Vivian Chin
*Assistant Examiner* — Douglas Suthers
(74) *Attorney, Agent, or Firm* — Rossi, Kimms & McDowell LLP

(57) ABSTRACT

A masking sound outputting device includes: an inputting unit which receives a picked-up sound signal relating to a picked-up sound; an extracting unit which extracts an acoustic feature amount of the picked-up sound signal; an instruction receiving unit which receives instructions for starting an output of a masking sound; and an outputting unit which, in the case where the instruction receiving unit receives the instructions for starting an output, outputs a masking sound corresponding to the acoustic feature amount extracted by the extracting unit.

18 Claims, 7 Drawing Sheets

| FEATURE AMOUNT | TIME ZONE | MASKING SOUND | | |
|---|---|---|---|---|
| | | DISTURBANCE SOUND | BACKGROUND SOUND | DRAMATIC SOUND |
| FEATURE AMOUNT A | 10:00 - 12:00 | DISTURBANCE SOUND A | BGM1 | DOOR CHIME SOUND |
| | 14:00 - 15:00 | DISTURBANCE SOUND A | BGM2 | PIANO SOUND |
| | 17:00 - 19:00 | DISTURBANCE SOUND A | BGM3 | - |
| | - | DISTURBANCE SOUND A | RUSTLE OF TREES | - |
| FEATURE AMOUNT B | - | DISTURBANCE SOUND B | SOUND OF BROOK | BELL SOUND |
| ⋮ | ⋮ | ⋮ | | |

(56) References Cited

FOREIGN PATENT DOCUMENTS

| | | | |
|---|---|---|---|
| JP | 2005534061 | A | 11/2005 |
| JP | 2007235864 | A | 9/2007 |
| JP | 2008233672 | A | 10/2008 |
| JP | 2009118062 | A | 5/2009 |
| JP | 2010085913 | A | 4/2010 |

OTHER PUBLICATIONS

International Search Report for PCT/JP2011/072131 dated Nov. 1, 2011.

* cited by examiner

FIG. 3

| FEATURE AMOUNT | TIME ZONE | MASKING SOUND | | |
|---|---|---|---|---|
| | | DISTURBANCE SOUND | BACKGROUND SOUND | DRAMATIC SOUND |
| FEATURE AMOUNT A | 10:00 - 12:00 | DISTURBANCE SOUND A | BGM1 | DOOR CHIME SOUND |
| | 14:00 - 15:00 | DISTURBANCE SOUND A | BGM2 | PIANO SOUND |
| | 17:00 - 19:00 | DISTURBANCE SOUND A | BGM3 | - |
| | - | DISTURBANCE SOUND A | RUSTLE OF TREES | - |
| FEATURE AMOUNT B | - | DISTURBANCE SOUND B | SOUND OF BROOK | BELL SOUND |
| ⋮ | ⋮ | ⋮ | | |

MASKING SOUND OUTPUTTING DEVICE AND MASKING SOUND OUTPUTTING METHOD

This application is a U.S. National Phase Application of PCT International Application PCT/JP2011/072131 filed on Sep. 27, 2011, which is based on and claims priority from JP 2010-216283 filed on Sep. 28, 2010, and JP 2011-057365 filed on Mar. 16, 2011, the contents of which is incorporated in its entirety by reference.

TECHNICAL FIELD

The present invention relates to a masking sound outputting device which outputs a masking sound for masking a sound, and also to a masking sound outputting method therefor.

BACKGROUND ART

A masking technique has been known in which, in order to form a comfortable environmental space in a worksite or the like, a sound that is felt uncomfortable by the listener is picked up, and another sound having acoustic characteristics (such as frequency characteristics) similar to the sound is output, thereby causing the uncomfortable sound to be hardly heard. For example, Patent Document 1 discloses a technique in which the frequency components of picked-up sounds in the periphery of the listener are analyzed, and a sound that, when mixed with the ambient sound, becomes another sound is produced and then output. The technique of Patent Document 1 can give the listener a comfortable sound which is different from the uncomfortable sound, without reducing the uncomfortable sound, and provide an environmental space which is comfortable to the listener.

PRIOR ART REFERENCE

Patent Document

Patent Document 1: JP-A-2009-118062

SUMMARY OF THE INVENTION

Problems to be Solved by the Invention

In Patent Document 1, however, all sounds in the periphery of the listener are masked, and therefore even a sound which is not felt uncomfortable by the listener, or which is necessary is masked. Consequently, there is a problem in that an unnecessary process is performed and the listener fails to hear necessary information.

Therefore, it is an object of the invention to provide a masking sound outputting device in which a sound to be masked or a timing can be selected, and also a masking sound outputting method therefor.

Means for Solving the Problems

In order to attain the object, the invention provides a masking sound outputting device including: an inputting unit adapted to input a picked-up sound signal relating to a picked-up sound; an extracting unit adapted to extract an acoustic feature amount of the picked-up sound signal; an instruction receiving unit adapted to receive an instruction for starting an output of a masking sound; and an outputting unit adapted to, when the instruction receiving unit receives the instruction for starting an output, output a masking sound corresponding to the acoustic feature amount extracted by the extracting unit.

Preferably, the masking sound outputting device further includes: a correspondence table indicating correspondence relationships between the acoustic feature amount and the masking sound; and a masking sound selecting unit adapted to refer the correspondence table by using the acoustic feature amount extracted by the extracting unit, to select the masking sound corresponding to the acoustic feature amount extracted by the extracting unit, and wherein the outputting unit outputs the masking sound selected by the masking sound selecting unit.

Preferably, a plurality of masking sounds are made correspondent to the acoustic feature amount, and the masking sound selecting unit selects a masking sound from the plurality of masking sounds which are made correspondent to the acoustic feature amount in the correspondence table, in accordance with a predetermined condition.

Preferably, the masking sound outputting device further includes a masking sound data storing unit configured to store sound data relating to masking sounds, and when the instruction receiving unit receives the instruction for starting the output, and it is determined that the acoustic feature amount extracted by the extracting unit is not stored in the correspondence table, the masking sound selecting unit compares the acoustic feature amount extracted by the extracting unit with acoustic feature amounts of the sound data relating to masking sounds, the sound data being stored in the masking sound data storing unit, and reads out sound data having an acoustic feature amount similar to the acoustic feature amount extracted by the extracting unit, from the masking sound data storing unit, and the outputting unit outputs a masking sound corresponding to the sound data.

Preferably, in the masking sound outputting device, the masking sound selecting unit stores the acoustic feature amount extracted by the extracting unit, and the sound data relating to the masking sound read out from the masking sound data storing unit, in the correspondence table while newly making correspondent data therebetween.

Preferably, the masking sound outputting device further includes a general-purpose masking sound storing unit configured to store sound data relating to a general-purpose masking sound; and a disturbance sound producing unit adapted to, in accordance with the acoustic feature amount extracted by the extracting unit, process sound data relating to a general-purpose masking sound, the sound data being stored in the general-purpose masking sound storing unit, to produce a disturbance sound which disturbs a sound to be masked, and the masking sound output from the outputting unit contains the disturbance sound produced by the disturbance sound producing unit.

Preferably, the masking sound outputting device further includes a disturbance sound producing unit adapted to, in accordance with the acoustic feature amount extracted by the extracting unit, process the picked-up sound signal to produce a disturbance sound which disturbs a sound to be masked, and the masking sound output from the outputting unit contains the disturbance sound produced by the disturbance sound producing unit.

Preferably, the masking sound contains a sound which is obtained by synthesizing continuous and intermittent sounds.

Preferably, a combination manner of combining the continuous and intermittent sounds contained in the masking sound is changed in accordance with the time when the masking sound is output.

Preferably, when the acoustic feature amount extracted by the extracting unit is coincident with or similar to the acoustic feature amount stored in the correspondence table, the masking sound selecting unit selects a masking sound corresponding to the coincident or similar acoustic feature amount, and the outputting unit automatically outputs the masking sound selected by the masking sound selecting unit.

Furthermore, the invention provides a masking sound outputting method including: an inputting step of inputting a picked-up sound signal relating to a picked-up sound; an extracting step of extracting an acoustic feature amount of the picked-up sound signal; an instruction receiving step of receiving an instruction for starting an output of a masking sound; and an outputting step of, when the instruction for starting an output is received in the instruction receiving step, outputting a masking sound corresponding to the acoustic feature amount extracted in the extracting step.

Preferably, the masking sound outputting method further includes a masking sound selecting step of referring a correspondence table showing correspondence relationships between the acoustic feature amount and a masking sound, to select the masking sound corresponding to the acoustic feature amount extracted in the extracting step, and the masking sound selected in the masking sound selecting step is output in the outputting step.

Preferably, a plurality of masking sounds are made correspondent to the acoustic feature amount; and in the masking sound selecting step, a masking sound is selected from the plurality of masking sounds which are made correspondent to the acoustic feature amount in the correspondence table, in accordance with a predetermined condition.

Preferably, a masking sound data storing unit which stores sound data relating to masking sounds is provided, and in the masking sound selecting step, when the instruction for starting the output is received in the instruction receiving step, and it is determined that the acoustic feature amount extracted in the extracting step is not stored in the correspondence table, the acoustic feature amount extracted in the extracting step is compared with acoustic feature amounts of the sound data relating to masking sounds, the sound data being stored in the masking sound data storing unit, sound data having an acoustic feature amount similar to the acoustic feature amount extracted in the extracting step are read out from the masking sound data storing unit, and a masking sound corresponding to the sound data is output in the outputting step.

Preferably, in the masking sound selecting step, the acoustic feature amount extracted in the extracting step, and the sound data relating to the masking sound read out from the masking sound data storing unit are stored in the correspondence table while newly making correspondent therebetween.

Preferably, a general-purpose masking sound storing unit which stores sound data relating to a general-purpose masking sound is provided, and the masking sound outputting method, further includes: a disturbance sound producing step of, in accordance with the acoustic feature amount extracted in the extracting step, processing sound data relating to a general-purpose masking sound, the sound data being stored in the general-purpose masking sound storing unit, to produce a disturbance sound which disturbs a sound to be masked, and the masking sound output in the outputting step contains the disturbance sound produced by the disturbance sound producing step.

Preferably, the method further includes a disturbance sound producing step of, in accordance with the acoustic feature amount extracted in the extracting step, processing the picked-up sound signal to produce a disturbance sound which disturbs a sound to be masked, and the masking sound output in the outputting step contains the disturbance sound produced by the disturbance sound producing step.

Preferably, the masking sound contains a sound which is obtained by synthesizing continuous and intermittent sounds.

Preferably, a combination manner of combining the continuous and intermittent sounds contained in the masking sound is changed in accordance with the time when the masking sound is output.

Preferably, in the masking sound selecting step, when the acoustic feature amount extracted in the extracting step is coincident with or similar to the acoustic feature amount stored in the correspondence table, a masking sound corresponding to the coincident or similar acoustic feature amount is selected, and in the outputting step, the masking sound selected in the masking sound selecting step is automatically output.

Advantageous Effects of the Invention

According to the invention, a sound to be masked is selected, and therefore it is possible to avoid a situation where a necessary sound is masked and necessary information is failed to be heard, or where a process of producing an unnecessary masking sound is performed.

BRIEF DESCRIPTION OF THE DRAWINGS

FIG. 3 is a view diagrammatically showing a masking sound selection table.

MODE FOR CARRYING OUT THE INVENTION

Hereinafter, a preferred embodiment of the masking sound outputting device of the invention will be described with reference to the drawings. In the masking sound outputting device of the embodiment, when the user (listener) performs an operation such as turning on of a switch, a sound which is picked up by a microphone is analyzed, and an adequate masking sound according to a result of the analysis is output. In the embodiment, namely, when the listener selects a sound to be masked or a timing, it is possible to form a comfortable environmental space where a sound which the listener does not wish to hear (including noises of an air-conditioning apparatus, noises from outside the room, and the like) is masked. Hereinafter, description will be made under the assumption that the listener who does not wish to hear the voice of a speaker is the user of the masking sound outputting device. Alternatively, the speaker who does not wish to cause the content of his/her own conversation to be heard by the listener may be the user of the masking sound outputting device.

Figure 1:
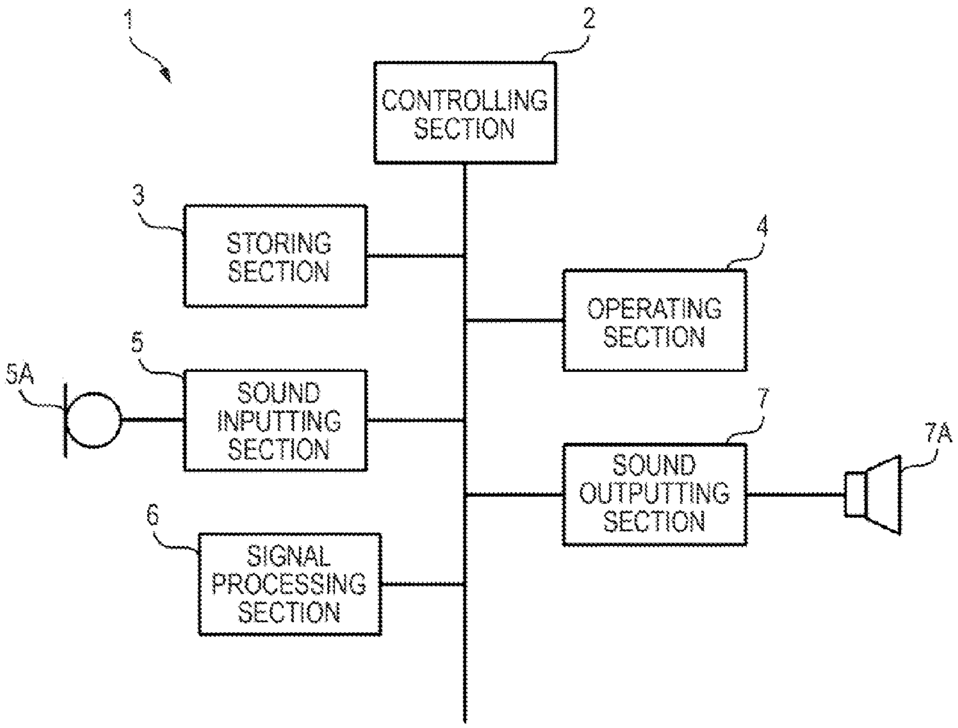
FIG. 1 is a block diagram diagrammatically showing the configuration of a masking sound outputting device of an embodiment.

FIG. 1 is a block diagram diagrammatically showing the configuration of the masking sound outputting device of the embodiment. The masking sound outputting device 1 includes a controlling section 2, a storing section 3, an operating section 4, a sound inputting section 5, a signal processing section 6, and a sound outputting section 7. The controlling section 2 is configured by, for example, a CPU (Central Processing Unit), and controls the operation of the masking sound outputting device 1. The storing section 3 is configured by a ROM (Read Only Memory), a RAM (Random Access Memory), or the like, and stores necessary programs, data, and the like which are to be read out by the controlling section 2, the signal processing section 6, etc. The operating section 4 receives operations of the user. For example, the operating section 4 is configured by a power supply switch for the masking sound outputting device 1, a switch which is used for, when the user feels uncomfortable, instructing to start an output of the masking sound, etc.

The sound inputting section 5 has an A/D converter which is not shown, and is connected to a microphone 5A. In the sound inputting section 5, a picked-up sound signal supplied from the microphone 5A is A/D converted by an A/D converter, and the converted signal is output to the signal processing section 6. The sound to be picked up by the microphone 5A includes the voice of the speaker, noises of an air-conditioning apparatus, noises from outside the room, and the like.

Figure 2:
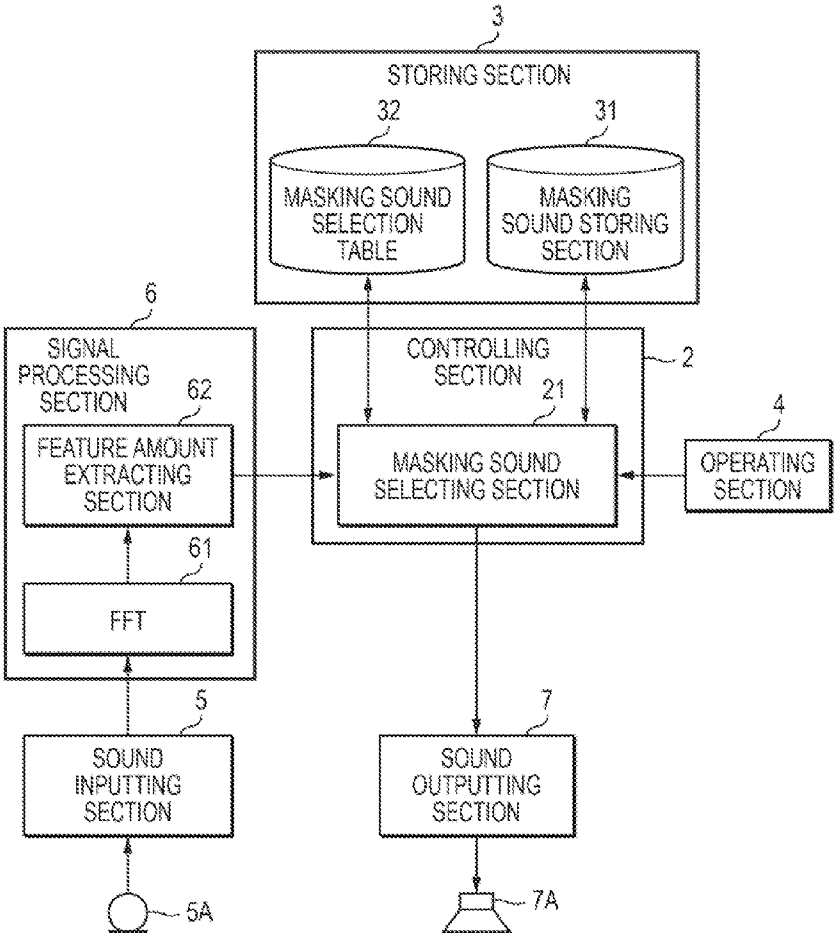
FIG. 2 is a block diagram diagrammatically showing the configurations of a signal processing section and storing section of the masking sound outputting device.

The signal processing section 6 is configured by, for example, a DSP (Digital Signal Processor), performs signal processing on the picked-up sound signal, and extracts an acoustic feature amount. The acoustic feature amount is a physical value which shows the features of a sound, and indicates, for example, a spectrum (levels of frequencies), peak frequencies (the basic frequency, formants, and the like) in a spectral envelope. FIG. 2 is a block diagram diagrammatically showing the configurations of the controlling section 2, the signal processing section 6, and the storing section 3. The signal processing section 6 includes an FFT (Fast Fourier Transform) 61 and a feature amount extracting section 62. The controlling section 2 includes a masking sound selecting section 21. The FFT 61 performs a Fourier transform on the picked-up sound signal supplied from the sound inputting section 5 to convert a time domain signal to a frequency domain signal.

The feature amount extracting section 62 extracts a feature amount (spectrum) of the picked-up sound signal which is Fourier-transformed by the FFT 61. Specifically, the feature amount extracting section 62 calculates the signal intensity for each frequency, extracts a spectrum in which the calculated signal intensity is equal to or larger than a threshold, and extracts the acoustic feature amount (hereinafter, often referred to simply as the feature amount). The feature amount is a physical value which shows the features of a sound, and indicates a spectrum (levels of frequencies) itself, the peak frequencies (the center frequency and level of each peak) of a spectral envelope, or the like. The feature amount extracting section 62 may determine a spectrum in which the signal intensity is equal to or smaller than the threshold, as unnecessary components, and set the spectrum to “0”. The threshold is a value corresponding to a level which at least the listener can perceive from an input sound containing various sounds such as noises. The threshold may be previously set, or input through the operating section 4.

The masking sound selecting section 21 selects sound data relating to a masking sound corresponding to the feature amount extracted by the feature amount extracting section 62, from the storing section 3, and outputs the sound data to the sound outputting section 7 (hereinafter, such sound data are referred to as masking sound data). The storing section 3 includes a masking sound storing section 31 and a masking sound selection table 32. The masking sound storing section 31 stores masking sound data of a plurality of time-base waveforms. The masking sound data may be previously (for example, at factory shipment) stored in the masking sound storing section 31, or, in each case, obtained from the outside via a network or the like, and then stored in the masking sound storing section 31. The masking sound selection table 32 is a data table in which the feature amount of the picked-up sound signal is made correspondent with the masking sound data stored in the masking sound storing section 31.

FIG. 3 is a view diagrammatically showing the masking sound selection table 32. The masking sound selection table 32 has a feature amount column, a time zone column, and a masking sound column, and information of columns are made correspondent to one another. The feature amount of the picked-up sound extracted by the feature amount extracting section 62 is stored in the feature amount column. A masking sound corresponding to the feature amount stored in the feature amount column is stored in the masking sound column. Specifically, the masking sound column is configured by a disturbance sound column, a background sound column, and a dramatic sound column, and addresses in the masking sound storing section 31 where data are stored are stored in the columns. A time zone which is suitable for outputting a corresponding masking sound is stored in the time zone column.

Disturbance sounds each of which mainly constitutes a masking effect are stored in the disturbance sound column. An example of the disturbance sounds is a conversational sound which is obtained by processing the voice of the speaker, and in which the produced content cannot be understood (a sound having no lexical meaning). The masking sound data contain at least one of the disturbance sounds. Steady (continuous) background sounds are stored in the background sound column. Examples of the background sounds are a BGM, a murmur of a brook, a rustle of trees, and the like. Sounds (dramatic sounds) which are unsteadily (intermittently) generated, and which have a high rendering effect, such as a piano sound, a door chime sound, and a bell sound are stored in the dramatic sound column. A background sound is repeatedly reproduced and output. A dramatic sound is output randomly or at the start of the repetition of the background sound which is repeatedly reproduced and output. The output timing of the dramatic sound may be determined by the data table. Since the disturbance sound lexically makes no sense, a feeling of strangeness may be sometimes produced. Therefore, the background noise level is increased by the background sound, and sounds such as the above-described disturbance sound are made inconspicuous, thereby reducing auditory strangeness caused by the disturbance sound. Furthermore, the attention of the listener is directed toward the dramatic sound, and strangeness dues to the disturbance sound is made inconspicuous in an auditory psychological manner.

In the masking sound data corresponding to feature amount A shown in FIG. 3, the background sound of a BGM, and the dramatic sound such as a piano sound or a door chime sound are synthesized with disturbance sound A. The BGM is a slow-tempo soothing music piece, an up-tempo music piece, or the like, and a sound which is suitable for the time zone of outputting a masking sound is synthesized with the disturbance sound A. As shown in FIG. 3, for example, BGM 1 with slow tempo is synthesized with the disturbance sound A in the time zone from 10 AM to 12 AM, and BGM 2 with up tempo and the like are synthesized with the disturbance sound A in the time zone (afternoon) from 14 PM to 15 PM. As a dramatic sound which is suitable for the time zone of outputting a masking sound, for example, a door chime sound is synthesized with the disturbance sound A in the morning, and a piano sound is synthesized with the disturbance sound A in the afternoon. Moreover, masking sound data in which the background sound of a murmur of a brook, and the dramatic sound of a bell sound are synthesized with disturbance sound B (for example, the voice of the speaker) are made correspondent to the feature amount B.

The masking sound selecting section 21 refers the address relating to the masking sound selected from the masking sound selection table 32, and acquires masking sound data from the masking sound storing section 31. For example, the masking sound selecting section 21 performs matching (comparison using cross correlation, or the like) between the feature amount extracted by the feature amount extracting section 62 and that stored in the feature amount column, and searches for a feature amount that is coincident with or similar in a degree in which it can be determined that approximate coincidence is attained. In the case where the feature amount extracted by the feature amount extracting section 62 is approximately coincident with the feature amount A as a result of the search and the current time is 11 hour, for example, the masking sound selecting section 21 refers the masking sound selection table 32 to select the masking sound of “Disturbance sound A+BGM 1+Door chime sound” corresponding to the feature amount A and the current time (11 hour). In the case where the current time does not correspond to the time zone column of the table, for example, the current time is 16 hour, the masking sound selecting section 21 selects the masking sound of “Disturbance sound A+Rustle of trees” in which the time zone column is blank, from the table. As a result, when the masking sound selected by the masking sound selecting section 21 is output, an uncomfortable feeling which may occur during disturbance can be prevented from being given to the listener, by the background sound and the dramatic sound while the object sound is disturbed and made hardly hearable (the content is made hardly understandable). In the case where a plurality of masking sounds correspond to one feature amount, the user may manually select a desired masking sound through the operating section 4.

In the masking sound selection table 32 shown in FIG. 3, various kinds of information are registered by the masking sound selecting section 21. Specifically, in the case where the user performs an operation of starting the output of a masking sound on the operating section 4, the masking sound selecting section 21 determines whether the feature amount extracted by the feature amount extracting section 62 is stored in the masking sound selection table 32 or not. If it is determined that the feature amount extracted by the feature amount extracting section 62 is not stored in the masking sound selection table 32, the masking sound selecting section 21 selects masking sound data appropriate for the feature amount from the masking sound storing section 31. For example, the masking sound selecting section 21 calculates cross correlations between the feature amount extracted by the feature amount extracting section 62 and a plurality of masking sound data in the masking sound data stored in the masking sound storing section 31, and selects masking sound data having the highest correlation. Alternatively, the masking sound selecting section 21 may select a plurality of masking sound data in descending order of correlation. At this time, the masking sound data stored in the masking sound storing section 31 have a time-base waveform. Therefore, the masking sound selecting section 21 may supply masking sound data to the signal processing section 6, and each time the signal processing section 6 may convert to a frequency domain signal and extract the feature amount. Alternatively, information (for example, the peak value of the spectrum) indicating the feature amount of masking sound data may be added as a header to masking sound data stored in the masking sound storing section 31. In this case, the masking sound selecting section 21 is required only to obtain correlations between the feature amount extracted by the feature amount extracting section 62 and headers (information indicating a feature amount) of masking sound data stored in the masking sound storing section 31, and it is possible to shorten the process which is performed by the masking sound selecting section 21 to select masking sound data from the masking sound storing section 31.

The masking sound selecting section 21 selects masking sound data having a high correlation with the feature amount which is extracted by the feature amount extracting section 62 as described above, and newly stores (registers) the address where the selected masking sound data are stored, and the extracted feature amount in the masking sound selection table 32 while they are made correspondent to each other. At this time, the time and season when the feature amount and the like are stored in the masking sound selection table 32 may be stored in the time zone column, or a time zone and season which are preset for the selected masking sound data may be stored. In the case where a plurality of masking sound data are selected for one feature amount, the user may be allowed to set the time zone or season when masking sound data are output, through the operating section 4.

Furthermore, in the case where masking sound data (masking sound data having a high correlation) optimum to the feature amount extracted by the feature amount extracting section 62 are not stored in the masking sound storing section 31, the masking sound selecting section 21 may acquire masking sound data having a high correlation from an external apparatus. For example, the external apparatus may be a personal computer which is connected to the masking sound outputting device, or a server apparatus which is connected via a network.

As described above, in the case where a feature amount is once stored (registered) in the masking sound selection table 32, when a sound of the same feature amount is thereafter picked up, the masking sound selecting section 21 can automatically select masking sound data appropriate for the extracted feature amount. If the extracted feature amount is not registered in the masking sound selection table 32, the masking sound selecting section 21 must perform a process (calculation of cross correlations with a plurality of masking sound data, and the like) of selecting masking sound data appropriate for the extracted feature amount from the masking sound storing section 31, for each outputting of a masking sound. This process requires a long time. By contrast, when the feature amount is once registered in the masking sound selection table 32, it is necessary only to read out corresponding masking sound data. Therefore, the time elapsed before the output of a masking sound can be shortened, and a comfortable environmental space in which the voice of the speaker is masked can be formed more rapidly. When a plurality of masking sound data are made correspondent to one feature amount and randomly changed, even in the case where the same sound is picked up, the same masking sound is not always output, and therefore the cocktail party effect can be suppressed and masking can be always adequately performed. When corresponding of masking sound data appropriate for respective time zones such as morning, noon, and evening is enabled, furthermore, a more comfortable environmental space can be formed.

Figure 4:
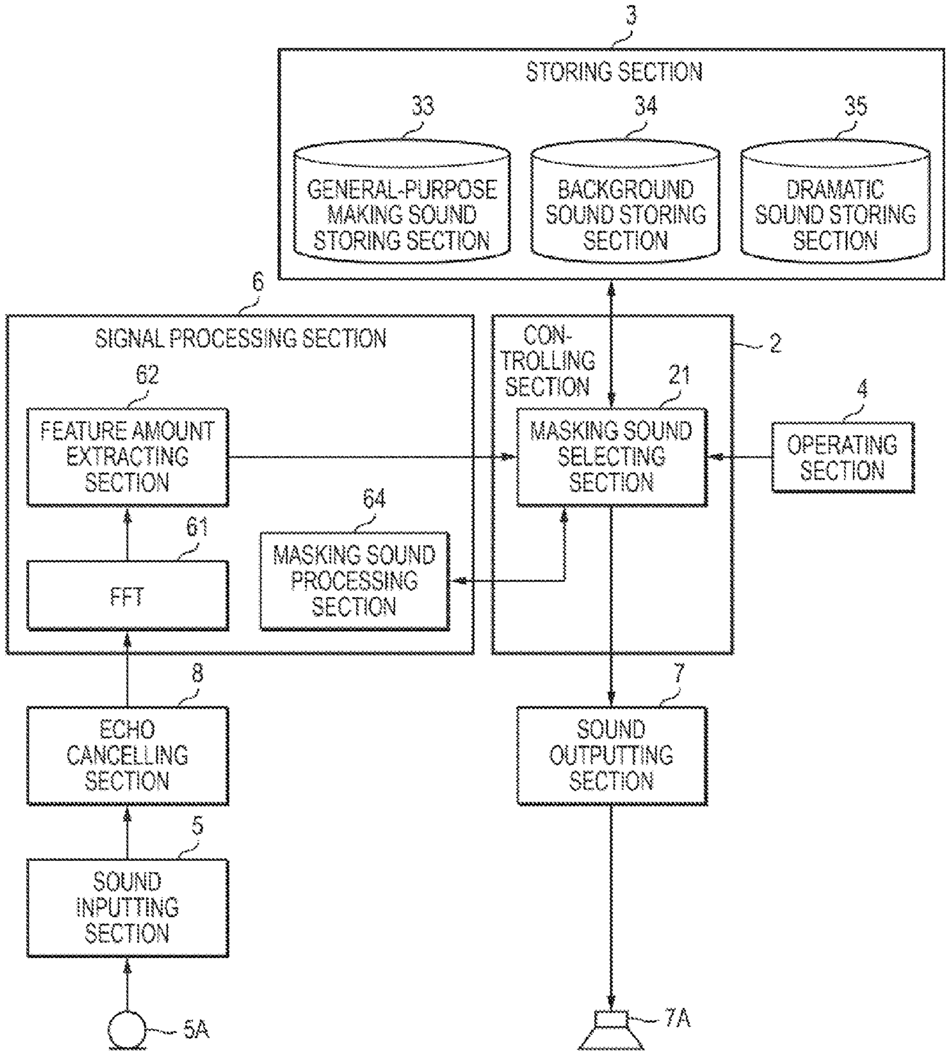
FIG. 4 is a block diagram diagrammatically showing a function of the signal processing section in the case where stored sound data are processed.

Alternatively, the signal processing section 6 may acquire sound data stored in the storing section 3, and process the sound data. FIG. 4 is a block diagram diagrammatically showing functions of the controlling section 2 and the signal processing section 6 in the case where stored sound data are processed. The signal processing section 6 shown in FIG. 4 includes a masking sound processing section 64 in addition to the configuration of the signal processing section 6 shown in FIG. 2. In the storing section 3, a general-purpose masking sound storing section 33 which stores data of a general-purpose masking sound (for example, voices of a plurality of men and women which cannot be understood), a background sound storing section 34 which stores background sound data (a BGM and the like), and a dramatic sound storing section 35 which stores dramatic sound data (a melody which is intermittently generated, and the like) are stored.

As shown in FIG. 4, the masking sound selecting section 21 acquires the general-purpose masking sound data from the general-purpose masking sound storing section 33, and outputs the data to the masking sound processing section 64. The masking sound processing section 64 converts the input masking sound data to a frequency domain signal, and processes the frequency characteristics of the masking sound data in accordance with the feature amount of the picked-up sound signal supplied from the masking sound selecting section 21. For example, the formant of the general-purpose masking sound is made coincident with that of the picked-up sound signal, converts the processed masking sound data to a time domain signal, and outputs the converted signal to the masking sound selecting section 21. As a result, in the case where the picked-up sound signal is the voice of the speaker, particularly, the output general-purpose masking sound is made closer to the feature of the voice of the speaker. Then, the masking sound selecting section 21 selects a BGM, a piano sound, and the like arbitrarily or in accordance with user's instructions from the background sound storing section 34 and the dramatic sound storing section 35, synthesizes the sound with processed general-purpose masking sound, and then outputs the synthesized sound to the sound outputting section 7. Therefore, an uncomfortable feeling which may occur during masking by the background sound and the dramatic sound can be prevented from being given to the listener, while the voice of the speaker is disturbed and made hardly hearable by the general-purpose masking sound which is close to the voice of the speaker. Also in this case, the feature amount of the picked-up sound signal which is once extracted, and data acquired from the storing section 3 may be made correspondent to each other, and stored in a table such as shown in FIG. 3. According to the configuration, subsequent to this, it is not necessary to instruct the process of selecting the background sound and the dramatic sound.

Figure 5:
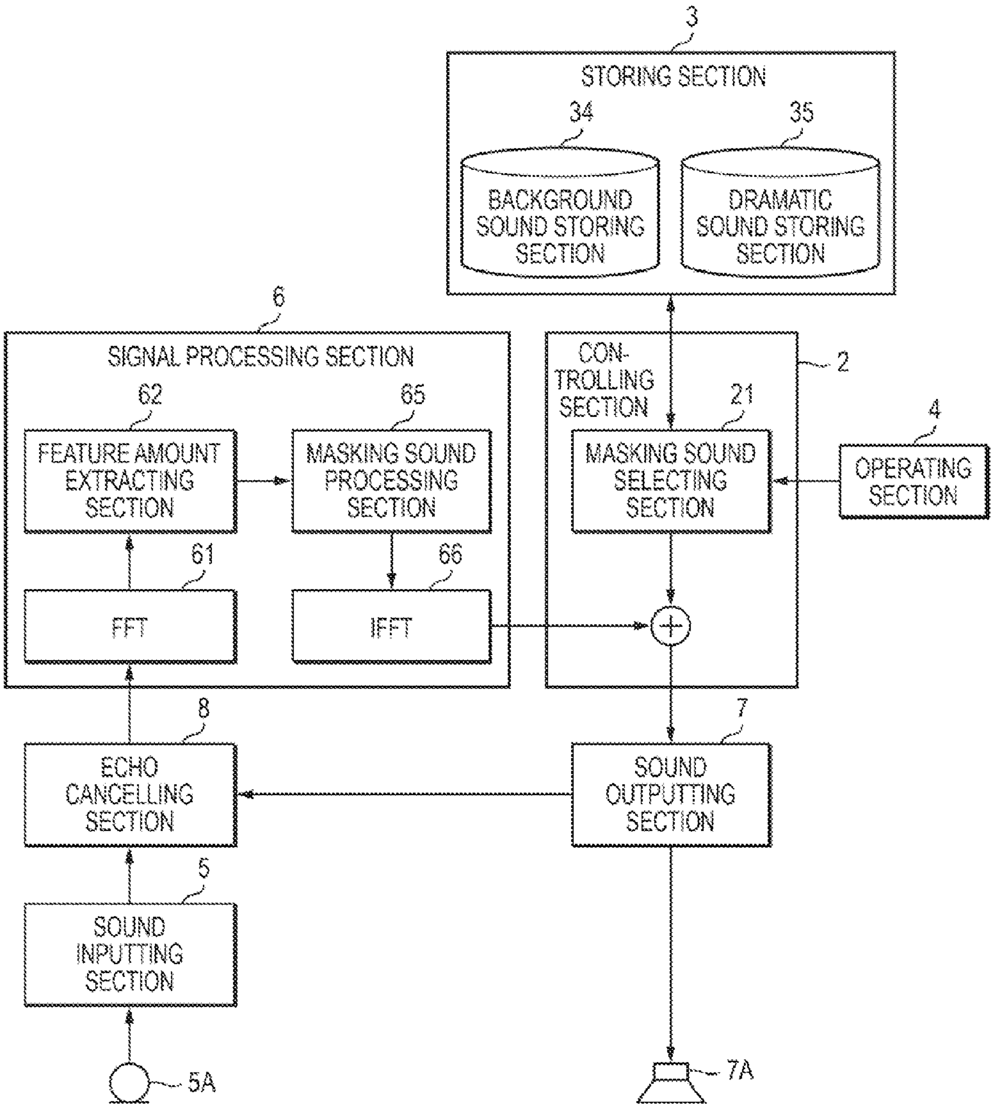
FIG. 5 is a block diagram diagrammatically showing a function of the signal processing section in the case where a picked-up sound signal is modified on the frequency axis.

In the embodiment, moreover, the signal processing section 6 may process the picked-up sound signal, and output it while being included in masking sound data. In this case, the signal processing section 6 modifies the picked-up sound signal on the time axis or the frequency axis, and converts the signal to a voice which cannot be understood. FIG. 5 is a block diagram diagrammatically showing the functions of the controlling section 2 and the signal processing section 6 in the case where the picked-up sound signal is modified on the frequency axis. The signal processing section 6 includes a masking sound processing section 65 and an IFFT (Inverse FFT) 66 in addition to the configuration of the signal processing section 6 shown in FIG. 2. For example, the masking sound processing section 65 extracts the formant frequencies from the picked-up sound signal, in the feature amount extracted by the feature amount extracting section 62, and performs an inversion of higher order formant frequencies to break the phonological structure, thereby producing a disturbance sound. The IFFT 66 converts the frequency domain signal which is processed by the masking sound processing section 65, to a time domain signal. The masking sound selecting section 21 of the controlling section 2 acquires a background sound, dramatic sound, and the like stored in the background sound storing section 34 and dramatic sound storing section 35 of the storing section 3, in accordance with the time zone, the season, or user's instructions. Then, the controlling section 2 synthesizes the disturbance sound which is converted to a time domain signal by the IFFT 66 with the background sound and dramatic sound acquired by the masking sound selecting section, and outputs the synthesized sound to the sound outputting section 7. According to the configuration, in the case where the user of the masking sound outputting device is set as the listener, it is possible to convert the content of the conversation of the speaker which the listener does not wish to hear, to a meaningless voice. Moreover, an uncomfortable feeling which may occur during masking by the background sound and the dramatic sound can be prevented from being given to the listener, and therefore an environmental space which is comfortable for the listener can be formed. Also in this case, as described with reference to FIG. 4, the feature amount of the picked-up sound signal which is once extracted, and data acquired from the storing section 3 may be made correspondent to each other, and stored in a table such as shown in FIG. 3.

In the configuration of FIG. 5, the masking sound outputting device 1 includes an echo cancelling section 8 which removes an echo from the picked-up sound signal supplied from the sound inputting section 5. In the masking sound outputting device 1 of FIG. 5, in the case where a masking sound is output from a loudspeaker 7A, the microphone 5A picks up feedback components of the masking sound, whereby the picked-up sound signal is caused to contain an echo. Therefore, the echo cancelling section 8 includes an adaptive filter, receives a masking sound (time domain signal) from the sound outputting section 7, and performs a filter process on the sound, thereby producing a pseudo recurrent sound signal which is a pseudo signal of components that are of the masking sound output from the loudspeaker 7A, and that wraps around the microphone 5A. When the pseudo recurrent sound signal is subtracted from the picked-up sound signal, the echo is removed. Therefore, the signal processing section 6 in the subsequent stage can remove a masking sound which wraps around the microphone 5A, from the picked-up sound signal, and correctly extract the voice of the speaker. Also in the configuration shown in FIGS. 1 and 2, the echo cancelling section 8 may be disposed in the subsequent stage of the sound inputting section 5.

In the examples of FIGS. 2, 4, and 5, the example in which the signal processing section 6 extracts a feature amount and processes sound data has been described. Alternatively, the controlling section 2 may execute programs stored in the storing section 3, thereby realizing the functions of the signal processing section 6.

The sound outputting section 7 has a D/A converter and amplifier which are not shown, and is connected to the loudspeaker 7A. In the sound outputting section 7, the signal relating to the masking sound data determined in the signal processing section 6 is D/A converted by the D/A converter, the amplitude (volume) is adjusted to an optimum value by the amplifier, and then amplified signal is output as a masking sound from the loudspeaker 7A.

Figure 6:
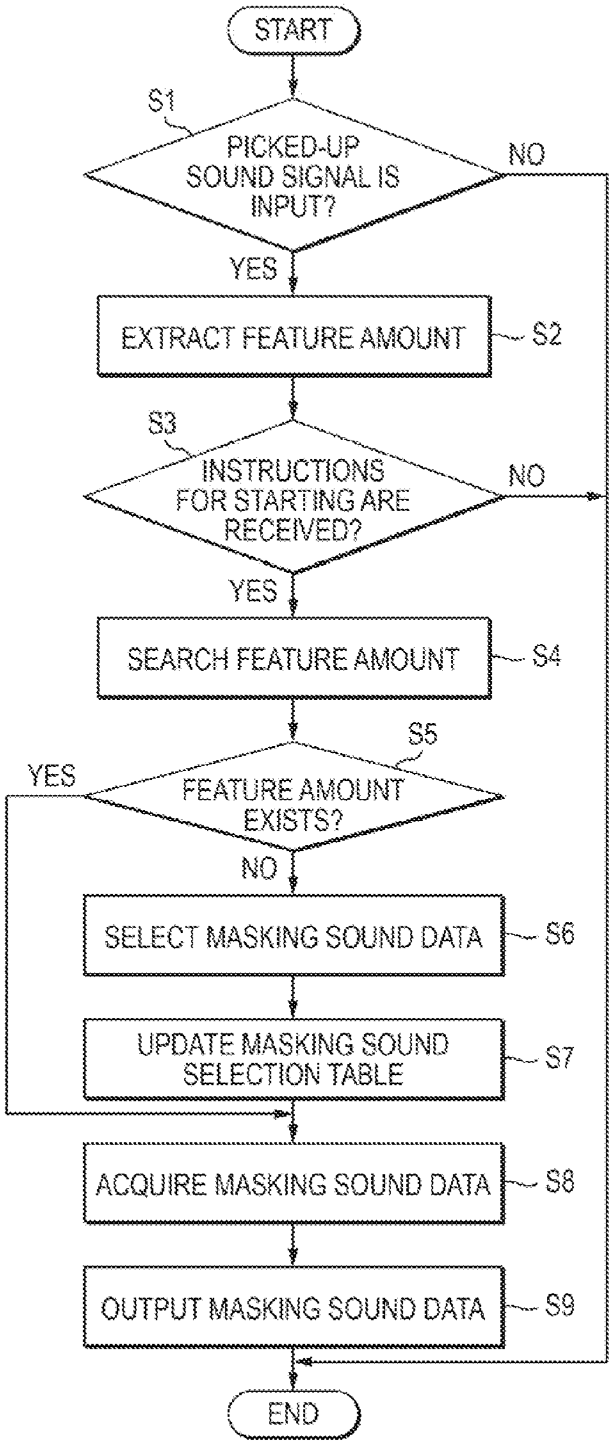
FIG. 6 is a flowchart showing the procedure of a process which is performed in the masking sound outputting device.

Next, the operation of the masking sound outputting device 1 will be described. FIG. 6 is a flowchart showing the procedure of a process which is performed in the masking sound outputting device 1. The process shown in FIG. 6 is executed by the controlling section 2 and the signal processing section 6.

The controlling section 2 (or the signal processing section 6) determines whether or not a picked-up sound signal of a level at which it is possible to determine that a sound exists is input from the sound inputting section 5 (S1). If such a picked-up sound signal is not input (S1: NO), the operation of FIG. 6 is ended. If such a picked-up sound signal is input (S1: YES), the signal processing section 6 performs a Fourier transform in the FFT 61, and then extracts the feature amount of the picked-up sound signal (S2). Next, the controlling section 2 determines whether instructions for starting an output of a masking sound are received through the operating section 4 or not (S3). If the output starting instructions are not received (S3: NO), the operation of FIG. 6 is ended.

If the output starting instructions are received (S3: YES), the controlling section 2 searches for the feature amount which is extracted in S2 from the masking sound selection table 32 (S4). The controlling section 2 determines whether the feature amount which is extracted in S2 is stored in the masking sound selection table 32 or not (S5). If the feature amount is not stored in the masking sound selection table 32 (S5: NO), namely, if a voice which has not been a target of masking is to be masked, the controlling section 2 selects the masking sound data which is appropriate for the extracted feature amount, from the masking sound storing section 31 (S6). The controlling section 2 may select masking sound data which are most similar to the extracted feature amount, or select a plurality of masking sound data. Moreover, the controlling section 2 may select masking sound data which are selected by the user.

The controlling section 2 stores the addresses where the extracted feature amount and the selected masking sound data are stored, in the masking sound selection table 32 to update the masking sound selection table 32 (S7). Next, the controlling section 2 acquires masking sound data corresponding to the extracted feature amount from the masking sound storing section 31 (S8). Specifically, the controlling section 2 refers the masking sound selection table 32, selects the masking sound corresponding to the extracted feature amount, acquires the address where the masking sound data of the selected masking sound are stored, and acquires data (masking sound data) stored at the address. The controlling section 2 outputs the acquired masking sound data to the sound outputting section 7 (S9), and the sound data are output as a masking sound from the loudspeaker 7A.

By contrast, if the feature amount which is extracted in S2 is stored in the masking sound selection table 32 (S5: YES), namely, if a voice which has been a target of masking is to be masked, the controlling section 2 acquires the masking sound data corresponding to the feature amount which is extracted in S2, from the masking sound storing section 31 (S8). In this case, the masking sound selection table 32 is not updated. Thereafter, the controlling section 2 outputs the acquired masking sound data to the sound outputting section 7 (S9), and the sound data are output as a masking sound from the loudspeaker 7A.

Figure 7:
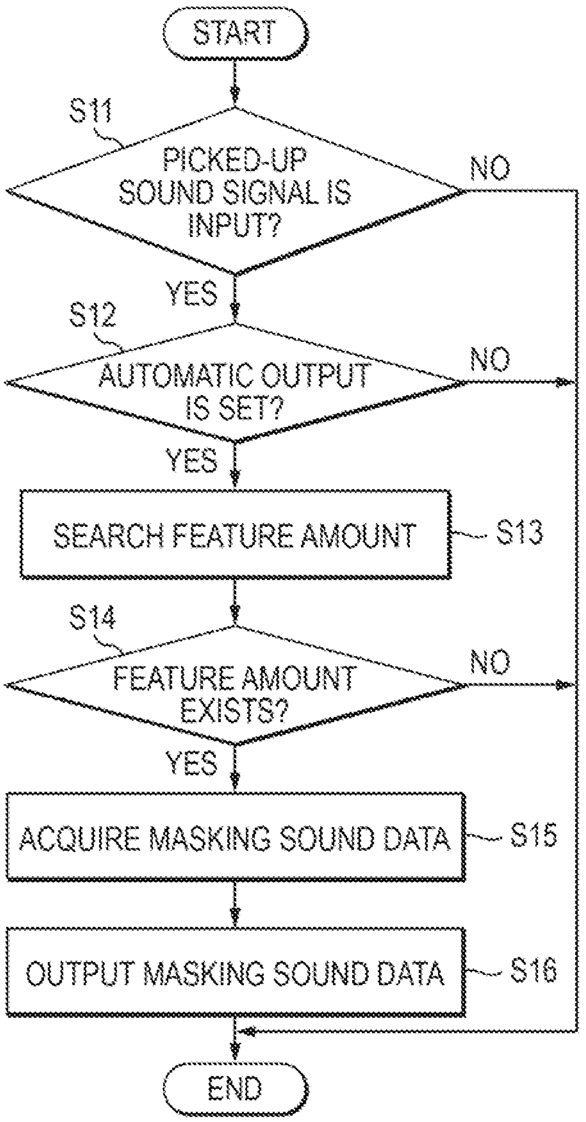
FIG. 7 is a flowchart showing the procedure of a process which is performed in the masking sound outputting device in the case where an output of a masking sound is automatically started.

In S3 in FIG. 6, in response to user's instructions for starting, the controlling section 2 manually starts the output of the masking sound. Alternatively, in the case where the feature amount which is extracted in S2 is coincident with the feature amount stored in the masking sound selection table 32, the masking sound may be automatically output. FIG. 7 is a flowchart showing the procedure of a process which is performed in the masking sound outputting device 1 in the case where the output of the masking sound is automatically started.

The controlling section 2 determines whether or not a picked-up sound signal of a level at which it is possible to determine that a sound exists is input from the sound inputting section 5 (S11). If such a picked-up sound signal is not input (S11: NO), the operation of FIG. 7 is ended. If such a picked-up sound signal is input (S11: YES), the controlling section 2 determines whether automatic starting of the output of a masking sound is set or not (S12). It is preferable to configure the controlling section so that the user can select through the operating section 4 whether the output of a masking sound is automatically started or not. If automatic starting of the output of a masking sound is not set (S12: NO), the operation of FIG. 7 is ended. If automatic starting of the output of a masking sound is set (S12: YES), the signal processing section 6 extracts the feature amount of the picked-up sound signal (S13).

Next, the controlling section 2 searches the masking sound selection table 32 for the feature amount extracted by the signal processing section 6, and determines whether the extracted feature amount is stored in the masking sound selection table 32 or not (whether a feature amount which is coincident with the extracted feature amount is stored in the masking sound selection table 32 or not) (S14). If the feature amount is not stored (S14: NO), the operation of FIG. 7 is ended. If stored (S14: YES), the controlling section 2 acquires masking sound data corresponding to the feature amount which is extracted in S13, from the masking sound storing section 31 (S15). The controlling section 2 outputs the acquired masking sound data to the sound outputting section 7 (S16), and the sound data are output as a masking sound from the loudspeaker 7A. The process is ended. As described above, even in the case where instructions for starting the output of a masking sound is not received from the user, when a sound having a feature amount which is already registered in the masking sound selection table 32 is input from the microphone 5A, the masking sound outputting device 1 can automatically start the output of a masking sound.

In the case where, in S14 in FIG. 7, the feature amount is not stored in the masking sound selection table 32, the process is ended. Similarly with S6 and S7 in FIG. 6, alternatively, the masking sound data which is appropriate for the extracted feature amount may be selected from the masking sound storing section 31, and the addresses where the extracted feature amount and the selected masking sound data are stored may be stored in the masking sound selection table 32 to update the masking sound selection table 32. In the case where, during the process of FIG. 7, the starting instructions are issued by the user, the process of FIG. 7 may be aborted, and the process subsequent to S4 shown in FIG. 6 may be performed to output a masking sound.

According to the embodiment, in the case where listener's instructions for starting the output of a masking sound is received, as described above, a masking sound for the picked-up sound is output. Namely, the listener can select a sound to be masked or a timing. As a result, although a sound which is felt uncomfortable is different depending on the user, it is possible to mask only a sound which is felt uncomfortable by each user, and an environmental space which is optimum to each user can be realized. Moreover, it is possible to avoid the possibility that, when all sounds are masked, the listener fails to hear necessary information. Furthermore, an unnecessary process in which a masking sound is produced for a sound that is not required to be masked can be reduced. Since a masking sound to be output can be changed in accordance with the time, a more comfortable environmental space can be provided to the listener.

Although the preferred embodiment has been described, a specific configuration of the masking sound outputting device 1 or the like may be appropriately changed in design. The functions and effects which are described in the above embodiment are a mere list of most favorable functions and effects produced by the invention. The functions and effects of the invention are not limited to those described in the above embodiment.

In the embodiment, for example, masking sounds to be output for each time are made correspondent. Alternatively, masking sounds to be output for each season may be made correspondent. The above-described embodiment is configured so that, even in the case where instructions for starting the output of a masking sound is not received through the operating section 4, a masking sound is automatically output. Alternatively, it may be configured so that, in the case where instructions for starting the output of a masking sound is not received, a masking sound is not output. In this case, in order to reduce a wasteful process, only when instructions for starting the output of a masking sound are received, the feature amount extracting section 62 may extract a feature amount.

The above-described embodiment is configured so that the masking sound outputting device 1 acquires masking sound data which are stored in the masking sound outputting device itself. Alternatively, it may be configured so that masking sound data stored in an external device are acquired. For example, the masking sound outputting device 1 may be configured so that it is connectable to a personal computer, and masking sound data stored in the personal computer are acquired, and accumulatively stored in the storing section 3. The masking sound outputting device 1 may have a configuration where the microphone 5A and the loudspeaker 7A are not integrally disposed, and a general-purpose microphone and a general-purpose loudspeaker are connectable. The masking sound outputting device 1 is configured as a dedicated apparatus for generating a masking sound. Alternatively, the masking sound outputting device may be a portable telephone, a PDA (Personal Digital Assistant), a personal computer, or the like.

Hereinafter, a summary of the invention will be described in detail.

The masking sound outputting device of the invention includes an inputting unit, an extracting unit, an instruction receiving unit, and an outputting unit. The inputting unit receives a picked-up sound signal relating to a picked-up sound. The extracting unit extracts an acoustic feature amount of the picked-up sound signal. The acoustic feature amount is a physical value which shows the features of a sound, and indicates, for example, a spectrum (levels of frequencies), peak frequencies (the basic frequency, formants, and the like) in a spectral envelope. The instruction receiving unit receives instructions for starting an output of a masking sound. The outputting unit outputs a masking sound corresponding to the acoustic feature amount extracted by the extracting unit, in the case where the instruction receiving unit receives the instructions for starting an output.

According to the configuration, from a picked-up sound signal, the acoustic feature amount relating to the picked-up sound signal is extracted, and, in the case where the start of an output of a masking sound is instructed by the user, or the case where the start of an output of a masking sound is instructed by means of automatic setting, the masking sound corresponding to the extracted acoustic feature amount is output. According to the configuration, when the user hears a sound which the user does not wish to hear, for example, the user performs an operation of instructing the start of an output of the masking sound, whereby only the sound which the user does not wish to hear can be masked. As a result, the user can select a sound to be masked, and therefore it is possible to avoid a situation where a sound which is not required to be masked is masked, and a problem in that necessary information is failed to be heard. Furthermore, an unnecessary process in which a masking sound is produced for a sound that is not required to be masked can be reduced.

In the masking sound outputting device of the invention, a mode is possible where the masking sound outputting device further includes: a correspondence table showing correspondence relationships between the acoustic feature amount and a masking sound; and a masking sound selecting unit which refers the correspondence table by using the acoustic feature amount extracted by the extracting unit, to select the masking sound corresponding to the acoustic feature amount. In this case, the outputting unit outputs the masking sound which is selected by the masking sound selecting unit.

According to the configuration, the table showing correspondence relationships between the acoustic feature amount relating to the picked-up sound, and the masking sound to be output is referred, whereby the masking sound corresponding to the picked-up sound is automatically output.

A mode is possible where a plurality of masking sounds are made correspondent to the acoustic feature amount, and the masking sound selecting unit selects a masking sound from the plurality of masking sounds which are made correspondent in the correspondence table, in accordance with predetermined conditions.

According to the configuration, even in the case where the same sound is to be masked, different masking sounds are output depending on the conditions. In the morning time zone, for example, a refreshing sound which is suitable for the morning is output, and, in the night time zone, a relaxing sound which is suitable for the night is output. Thereafter, an adequate masking sound according to the use status of the user is output.

In the masking sound outputting device of the invention, a mode is possible where the masking sound outputting device further includes a masking sound data storing unit which stores sound data relating to masking sounds. In the case where the instruction receiving unit receives the instructions for starting an output, and it is determined that the acoustic feature amount extracted by the extracting unit is not described in the correspondence table, the masking sound selecting unit compares the acoustic feature amount extracted by the extracting unit with acoustic feature amounts of the sound data relating to masking sounds, the sound data being stored in the masking sound data storing unit, reads out data relating to the masking sound corresponding to the acoustic feature amount, from the masking sound data storing unit, and outputs a masking sound corresponding to the sound data to the outputting unit.

According to the configuration, sound data relating to masking sounds are stored in the masking sound data storing unit, and, even in the case where a masking sound corresponding to the picked-up sound does not exist, a masking sound which is adequate to the extracted acoustic feature amount (for example, a sound having a similar acoustic feature amount) can be automatically output.

Preferably, the masking sound selecting unit stores the acoustic feature amount extracted by the extracting unit, and the sound data relating to a read out masking sound, in the correspondence table while newly making correspondent.

When a masking sound having the same acoustic feature amount is subsequently picked up, therefore, a masking sound which is identical with a previously output masking sound can be automatically output.

Preferably, the masking sound outputting device further includes a general-purpose masking sound storing unit which stores sound data relating to a general-purpose masking sound, and includes a disturbance sound producing unit which, in accordance with the acoustic feature amount extracted by the extracting unit, processes sound data relating to a general-purpose masking sound, the sound data being stored in the general-purpose masking sound storing unit, to produce a disturbance sound which disturbs a sound to be masked, and the masking sound output from the outputting unit contains the disturbance sound produced by the disturbance sound producing unit.

According to the configuration, the general-purpose masking sound stored in the general-purpose masking sound storing unit is processed in accordance with the acoustic feature amount of the picked-up sound signal, and a disturbance sound is produced. For example, the general-purpose masking sound is configured by voices of a plurality of men and women which cannot be understood (a sound having no substantial lexical meaning). The disturbance sound is a sound in which the feature amount of the general-purpose masking sound is made close to that of the picked-up sound. Similarly with the general-purpose masking sound, the disturbance sound is a sound which has no lexical meaning, and which has a sound quality (voice quality) and pitch close to the sound to be masked. Therefore, it is possible to attain a high masking effect.

In the masking sound outputting device of the invention, a mode is possible where, in accordance with the acoustic feature amount extracted by the extracting unit, the picked-up sound signal is processed to produce a disturbance sound which disturbs a sound to be masked. In this case, the masking sound output from the outputting unit contains the disturbance sound produced by the disturbance sound producing unit.

According to the configuration, the picked-up sound is processed, and the disturbance sound is produced. For example, the disturbance sound is produced by modifying the frequency characteristics of the picked-up sound signal, and breaking the phonological structure. In this case, the disturbance sound is a sound which has a sound quality (voice quality) and pitch that are substantially identical with the actual sound to be masked. Therefore, it is possible to attain a higher masking effect.

Preferably, the masking sound in the invention contains a sound which is obtained by synthesizing continuous and intermittent sounds.

For example, the continuous sound contains a disturbance sound such as described above, a background sound (steady natural sound) such as a murmur of a brook or a rustle of trees, or the like. As described above, a disturbance sound is produced by breaking the phonological structure, and therefore a feeling of strangeness may be sometimes produced. Therefore, the feeling of strangeness in a disturbance sound is reduced by increasing the background noise level by means of a background sound to make a sound such as the above-described disturbance sound inconspicuous. For example, the intermittent sound is a sound (dramatic sound) which is intermittently generated, and which has a high rendering effect, such as a melody sound. The attention of the listener is directed toward the dramatic sound, and strangeness dues to the disturbance sound is made inconspicuous in an auditory psychological manner.

Preferably, the combination manner of combining the continuous and intermittent sounds contained in the masking sound is changed in accordance with the time when the masking sound is output.

When the combination manner of a masking sound is changed in accordance with the time period or timing (season) when a masking sound is output, an output of a more comfortable masking sound is enabled. In the morning time zone, for example, a background sound containing a bird song is output to enable easy wake, and, in the night time zone, a dramatic sound is eliminated so as to attain a relaxed state.

The application is based on Japanese Patent Application (No. 2010-216283) filed on Sep. 28, 2010 and Japanese Patent Application (No. 2011-057365) filed Mar. 16, 2011, and their disclosure is incorporated herein by reference.

INDUSTRIAL APPLICABILITY

According to the masking sound outputting device and masking sound outputting method of the invention, when the user hears a sound which the user does not wish to hear, the user performs an operation of instructing the start of an output of a masking sound, whereby only the sound which the user does not wish to hear can be masked. As a result, the user can select a sound to be masked, and therefore it is possible to avoid a situation where a sound which is not required to be masked is masked, and a problem in that necessary information is failed to be heard. Furthermore, an unnecessary process in which a masking sound is produced for a sound that is not required to be masked can be reduced.

DESCRIPTION OF REFERENCE NUMERALS AND SIGNS

1 masking sound outputting device
2 controlling section
3 storing section (masking sound data storing unit)
4 operating section (instruction receiving unit)
5 sound inputting section (sound pick-up unit)
6 signal processing section
7 sound outputting section (outputting unit)
31 masking sound storing section
32 masking sound selection table
62 feature amount extracting section (extracting unit)
63 masking sound selecting section (masking sound selecting unit

The invention claimed is:

1. A masking sound outputting device comprising:

a sound inputting device having an A/D converter that receives a picked-up sound signal corresponding to a picked-up sound;

a sound outputting device having a D/A converter that outputs a masking sound;

a memory storing a plurality of masking sounds and a correspondence table indicating correspondence relationships between an acoustic feature amount and the plurality of masking sounds;

at least one processor configured to execute:

an extracting task that extracts an acoustic feature amount from the picked-up sound signal;

an instruction receiving task that receives an instruction for starting an output of a masking sound; and a masking sound selecting task that, when the instruction receiving task receives the instruction for starting an output, selects a masking sound, among a plurality of masking sounds corresponding to the acoustic feature amount extracted by the extracting task, based on the correspondence table, and outputs the selected masking sound to the sound outputting device, wherein the masking sound selecting task randomly selects the masking sound, among the plurality of masking sounds corresponding in the correspondence table, to change the masking sound output to the sound outputting device.

2. The masking sound outputting device according to claim 1, wherein, in a case where the memory is not stored with any masking sound corresponding to the extracted feature amount, the masking sound selecting task selects the masking sound in accordance with a predetermined condition.

3. The masking sound outputting device according to claim 1, wherein:

the at least one processor is further configured to execute a masking sound data storing task that stores sound data relating to masking sounds in the memory, and when the instruction receiving task receives the instruction for starting the output and the acoustic feature amount extracted by the extracting task is not stored in the correspondence table, the masking sound selecting task compares the acoustic feature amount extracted by the extracting task with acoustic feature amounts of the sound data relating to masking sounds, and reads out from the memory sound data having an acoustic feature amount similar to the acoustic feature amount extracted by the extracting task, and selects the masking sound corresponding to the sound data.

4. The masking sound outputting device according to claim 3, wherein the masking sound data storing task stores in the memory the acoustic feature amount extracted by the extracting task, and the sound data relating to the masking sound read out from the memory, in the correspondence table while newly creating correspondent data therebetween.

5. The masking sound outputting device according to claim 1, wherein:

the memory includes a general-purpose masking sound storing area that stores sound data relating to a general-purpose masking sound, the at least one processor is further configured to execute a disturbance sound producing task that, in accordance with the acoustic feature amount extracted by the extracting task, process sound data relating to a general-purpose masking sound, the sound data being stored in the general-purpose masking sound storing area, to produce a disturbance sound that disturbs the sound to be masked, and the output masking sound contains the disturbance sound produced by the disturbance sound producing task.

6. The masking sound outputting device according to claim 1, wherein:

the at least one processor is further configured to execute a disturbance sound producing task that, in accordance with the acoustic feature amount extracted by the extracting task, process the picked-up sound signal to produce a disturbance sound that disturbs a sound to be masked, and the output masking sound contains the disturbance sound produced by the disturbance sound producing task.

7. The masking sound outputting device according to claim 1, wherein the masking sound contains a sound obtained by synthesizing continuous and intermittent sounds.

8. The masking sound outputting device according to claim 7, wherein a combination manner of combining the continuous and intermittent sounds contained in the masking sound is changed in accordance with the time when the masking sound is output.

9. The masking sound outputting device according to claim 1, wherein, in a case where the memory is not stored with any masking sound corresponding to the extracted feature amount and the acoustic feature amount extracted by the extracting task is coincident with or similar to the acoustic feature amount stored in the correspondence table, the masking sound selecting task selects a masking sound corresponding to the coincident or similar acoustic feature amount, and automatically outputs the selected masking sound to the sound outputting device.

10. A masking sound outputting method comprising:

an inputting step of inputting a picked-up sound signal relating to a picked-up sound via a sound inputting device having an A/D converter;

an extracting step of extracting an acoustic feature amount from the picked-up sound signal;

a storing step of storing in a memory a plurality of masking sounds and a correspondence table indicating correspondence relationships between an acoustic feature amount and the plurality of masking sounds;

an instruction receiving step of receiving an instruction for starting an output of a masking sound; and a masking sound selecting step of, when the instruction for starting an output is received in the instruction receiving step, selecting a masking sound, among a plurality of masking sounds corresponding to the acoustic feature amount extracted in the extracting step, based on the correspondence table, and outputting the selected masking sound to a sound outputting device having a D/A converter, wherein the masking sound selecting step randomly selects the masking sound, among the plurality of masking sounds corresponding in the correspondence table, to change the masking sound output to the sound outputting device.

11. The masking sound outputting method according to claim 10, wherein, in a case where the memory is not stored with any masking sound corresponding to the extracted feature amount, the masking sound selecting step selects the masking sound in accordance with a predetermined condition.

12. The masking sound outputting method according to claim 10, further comprising:

a masking sound data storing step of storing in the memory sound data relating to masking sounds, wherein the masking sound selecting step, when the instruction for starting the output is received in the instruction receiving step and the acoustic feature amount extracted in the extracting step is not stored in the correspondence table, compares the acoustic feature amount extracted in the extracting step with acoustic feature amounts of the sound data relating to masking sounds, reads sound data having an acoustic feature amount similar to the acoustic feature amount extracted in the extracting step from the memory, and selects the masking sound corresponding to the sound data output to the sound outputting device.

13. The masking sound outputting method according to claim 12, wherein the masking sound data storing step stores in the memory the acoustic feature amount extracted in the extracting step, and the sound data relating to the masking sound read out from the memory, in the correspondence table while newly creating correspondent therebetween.

14. The masking sound outputting method according to claim 10, wherein:

the memory includes a general-purpose masking sound storing area that stores sound data relating to a general-purpose masking sound, the masking sound outputting method further comprises a disturbance sound producing step of, in accordance with the acoustic feature amount extracted in the extracting step, processing sound data relating to a general-purpose masking sound, the sound data being stored in the general-purpose masking sound storing area, to produce a disturbance sound that disturbs the sound to be masked, and the output masking sound contains the disturbance sound produced by the disturbance sound producing step.

15. The masking sound outputting method according to claim 10, further comprising:

a disturbance sound producing step of, in accordance with the acoustic feature amount extracted in the extracting step, processing the picked-up sound signal to produce a disturbance sound that disturbs a sound to be masked, wherein the output masking sound contains the disturbance sound produced by the disturbance sound producing step.

16. The masking sound outputting method according to claim 10, wherein the masking sound contains a sound obtained by synthesizing continuous and intermittent sounds.

17. The masking sound outputting method according to claim 16, wherein a combination manner of combining the continuous and intermittent sounds contained in the masking sound is changed in accordance with the time when the masking sound is output.

18. The masking sound outputting method according to claim 10, wherein, in a case where the memory is not stored with any masking sound corresponding to the extracted feature amount and the acoustic feature amount extracted in the extracting step is coincident with or similar to the acoustic feature amount stored in the correspondence table, the masking sound selecting step selects a masking sound corresponding to the coincident or similar acoustic feature amount, and automatically outputs the selected masking sound to the sound outputting device.

* * * * *